(12) United States Patent
Rider

(10) Patent No.: US 8,889,983 B2
(45) Date of Patent: Nov. 18, 2014

(54) LUMINESCENT SOLAR CONCENTRATOR

(75) Inventor: Christopher B. Rider, Hardwick (GB)

(73) Assignee: Eastman Kodak Company, Rochester, NY (US)

( * ) Notice: Subject to any disclaimer, the term of this patent is extended or adjusted under 35 U.S.C. 154(b) by 1000 days.

(21) Appl. No.: 12/963,669

(22) Filed: Dec. 9, 2010

(65) Prior Publication Data
US 2011/0146757 A1 Jun. 23, 2011

(51) Int. Cl.
*H01L 31/052* (2014.01)
*H01L 31/055* (2014.01)

(52) U.S. Cl.
CPC ............ *H01L 31/0524* (2013.01); *Y02E 10/52* (2013.01); *H01L 31/0525* (2013.01); *H01L 31/055* (2013.01)
USPC .......................................... 136/259; 136/246

(58) Field of Classification Search
USPC ................................. 136/259, 246
See application file for complete search history.

(56) References Cited

U.S. PATENT DOCUMENTS

| | | | |
|---|---|---|---|
| 4,110,123 A | 8/1978 | Goetzberger et al. |
| 4,127,425 A | 11/1978 | Chambers |
| 4,135,537 A | 1/1979 | Blieden et al. |
| 4,140,544 A | 2/1979 | Sill |
| 4,144,097 A | 3/1979 | Chambers et al. |
| 4,149,902 A | 4/1979 | Mauer et al. |
| 4,153,813 A | 5/1979 | Blieden et al. |
| 4,155,371 A | 5/1979 | Wohlmut et al. |
| 4,159,212 A | 6/1979 | Yerkes |
| 4,164,432 A | 8/1979 | Boling |
| 4,173,495 A | 11/1979 | Rapp et al. |
| 4,175,980 A | 11/1979 | Davis et al. |
| 4,184,895 A | 1/1980 | Oster |
| 4,186,033 A | 1/1980 | Boling et al. |
| 4,188,238 A | 2/1980 | Boling |
| 4,188,239 A | 2/1980 | Boling |
| 4,190,465 A | 2/1980 | Boling |
| 4,193,819 A | 3/1980 | Wohlmut |
| 4,199,376 A | 4/1980 | Sill |
| 4,227,939 A | 10/1980 | Zewail et al. |
| 4,238,247 A | 12/1980 | Oster |
| 4,251,284 A | 2/1981 | Oster |
| 4,251,288 A | 2/1981 | Yerkes |

(Continued)

FOREIGN PATENT DOCUMENTS

| | | |
|---|---|---|
| EP | 2 139 048 | 12/2009 |
| JP | 63-159812 | 7/1988 |

(Continued)

OTHER PUBLICATIONS

Mauer, Paul B. et al., "Flourescent Concentrator for Solar Energy Collection", Research Disclosure No. 12930, Jan. 1975.

(Continued)

*Primary Examiner* — Golam Mowla
(74) *Attorney, Agent, or Firm* — William R. Zimmerli

(57) ABSTRACT

A solar concentrator device comprising a solar concentrator element comprising a radiation transmissive surface, a radiation absorptive material and a radiation concentrating/collection point and disposed on the incident radiation side thereof a recapture element for recapturing at least a portion of radiation lost from the concentrator element has improved solar radiation collection efficiency by reintroducing recaptured radiation into the concentrator element or by propagating said recaptured radiation through the recapture element to a radiation concentration point associated with the recapture element. It has been found that planar elements having a grooved or corrugated outer surface make for very good recapture elements for planar concentrator elements.

15 Claims, 5 Drawing Sheets

(56) References Cited

U.S. PATENT DOCUMENTS

| | | |
|---|---|---|
| 4,324,946 A | 4/1982 | Gravisse |
| 4,357,486 A | 11/1982 | Blieden et al. |
| 4,367,367 A | 1/1983 | Reisfeld et al. |
| 4,488,047 A | 12/1984 | Thomas |
| 4,539,625 A | 9/1985 | Bornstein et al. |
| 4,661,649 A | 4/1987 | Reisfeld et al. |
| 4,687,880 A | 8/1987 | Morris |
| 4,799,748 A | 1/1989 | Brown |
| 5,431,742 A | 7/1995 | Kleinerman |
| 5,816,238 A | 10/1998 | Burns et al. |
| 6,476,312 B1 | 11/2002 | Barnham |
| 2006/0107993 A1 | 5/2006 | Wilhelm et al. |
| 2006/0227542 A1 | 10/2006 | Richmond |
| 2008/0121270 A1 | 5/2008 | Mayer et al. |
| 2008/0149165 A1 | 6/2008 | Hoeks et al. |
| 2008/0223438 A1 | 9/2008 | Xiang et al. |
| 2008/0230112 A1 | 9/2008 | Barnham et al. |
| 2009/0229652 A1 | 9/2009 | Mapel et al. |

FOREIGN PATENT DOCUMENTS

| | | |
|---|---|---|
| WO | 84/03553 | 9/1984 |
| WO | 93/08606 | 4/1993 |
| WO | 2006/088369 | 8/2006 |
| WO | 2006/088370 | 8/2006 |
| WO | 2009/095310 | 8/2009 |

OTHER PUBLICATIONS

Weber, W. H. et al., "Luminescent Greenhouse Collector for Solar Radiation", Applied Optics, vol. 15, No. 10, pp. 2299-2300, Oct. 1976.
Hayashibara, M. et al., "Concentrators Using Fluorescent Susbstances", Int. J. Solar Energy, vol. 8, pp. 71-19, 1990.
Reisfeld, R. et al., "Luminescent Solar Concentrators for Energy Conversion", Structure and Bonding 49, Springer Verlag, 1982.
Reisfeld, R., "Spectroscopy and Applications of Molecules in Glasses", Journal of Non-Crystalline Solids 121, pp. 254-266, 1990.
Olson, R. W. et al., "Luminescent Solar Concentrators and the Reabsorbtion Problem", Applied Optics, vol. 20, No. 17, pp. 2934-2940, Sep. 1981.
M.K.Nazeeruddin et al, J.Am.Chem.Soc.125, 2003, 8790.
Sandrini et al, J. Am. Chem. Soc.109, 1987, 7720.
Williams, J.A.G. et al, Inorg.Chem. 42, 2003, 8609.
Brooks, J. et al, Inorg. Chem. 41, 2002, 3055.
Forward, J. M. et al, Inorg.Chem. 34, 1995, 6330.
Gallagher et al, Solar Energy 81, 2007, 813-821.
P.Coppo et al, Chem.Com. 15, 2004, 1774.
Eastwood, D. L. et al, J.Mol.Spectrosc. 35, 1970, 359.
Kavitha, J. et al, Adv.Funct.Mater. 15, 2005, 223.
Förster, T., Fluorescenz Organische Verbindungen, Göttingen: Vandenhoech and Ruprech, 1951.

LUMINESCENT SOLAR CONCENTRATOR

FIELD OF THE INVENTION

This invention relates to the field of solar concentrators, especially for solar photovoltaic devices, and more particularly to planar concentrators such as luminescent planar concentrators (LPCs) and to methods for increasing the efficiency of LPCs.

BACKGROUND OF THE INVENTION

Photovoltaic cells are a means for converting incident radiation, typically actinic radiation such as solar radiation, into electrical energy. There is significant interest worldwide in the generation of power from sunlight. Radiation concentration is finding increasing relevance for the purpose of improving the efficiency or applicability of photovoltaic (PV) cells used for power generation for three reasons: first, because for some PV technologies, higher incident illumination intensity actually increases the efficiency of power conversion; second, because it is believed that for some applications, it may prove to be a more cost-effective approach for large area power generation and third, because for some applications, it is more practical to deploy concentrators than photovoltaic cells.

Many PV cells, however, require for their manufacture materials that are expensive and energy-intensive to produce. Accordingly, in order to improve the operating efficiency, applicability and cost-effectiveness of solar PV cells, light concentration approaches are being actively developed. Solar concentrators collect light over a large area and concentrate the light down onto a small area of photovoltaic cell (pv).

Two broad classes of solar concentrator are being developed. A first is a geometric solar concentrator, which can take the form of a reflective or refractive concentrating element. A reflective or refractive (geometric) solar concentrator operates by efficiently redirecting or focusing solar radiation incident on concave reflective surfaces or lenses onto a solar PV cell or cell array. A refractive solar concentrator operates by optically focusing radiation incident on a large lens surface onto the smaller PV cell or cell array surface. Whilst this approach has met with some success, the light concentrator optical elements, typically mirrors or lenses, need to be very robust and may not themselves be cheap items. Furthermore, the greater the concentration ratio, the smaller is the acceptance angle to the concentrator with the result that high-concentration systems also have the disadvantage that they are required to track the sun for efficient concentration and also are not very effective in diffuse light (e.g. cloudy weather).

The second class might be termed absorptive-emissive concentrators and act by absorbing the incident radiation and re-emitting radiation to a PV cell or cell array. These are also widely referred to as luminescent concentrators.

The absorptive-emissive or luminescent form of concentrator typically comprises a sheet of radiation-receptive material, the sheet itself being typically transparent, doped with a material capable of absorbing the incident radiation and then re-emitting radiation, which is typically a luminescent material, e.g. fluorescent material. The emitted radiation may then be directed via a waveguide to a PV array, typically positioned at the edge of the sheet (and thereby covering a much smaller area than if employed as the direct radiation absorber). The waveguide, which directs the re-emitted radiation to the edge of the sheet, is typically the sheet itself, by trapping the re-emitted radiation within the sheet by internal reflection. The absorptive-emissive radiation concentrators have the advantage that they do not need to track incident radiation for effective trapping of incident radiation and they are also effective in diffuse light.

The absorbing materials are typically fluorescent dyes or pigments which absorb energy within the solar spectrum and efficiently re-emit in a relatively narrow bandwidth, typically at a longer wavelength. A significant proportion of the re-emitted radiation (typically at least 70%) is trapped within the waveguide formed by the sheet by total internal reflection and may thereupon impinge upon the PV element configured at the edge of the sheet, which can then convert the radiation into electrical energy. The remainder of the emitted radiation (typically up to 30%) escapes from the waveguide and is lost.

There are several advantages associated with these absorptive-emissive or luminescent concentrators over geometrical concentrators. Most notably, there is a lesser requirement to track incident radiation in order to receive high concentration of light. Further, the collection efficiency is high even in diffuse light conditions. Large areas of luminescent solar concentrator enable good heat dissipation to air. Furthermore, the efficiency of a photovoltaic device or other radiation receiving device can be optimised by selecting a luminescent material (e.g. dye) which re-emits at a wavelength closer to the maximum spectral sensitivity of the PV or other receiving device. Luminescent planar concentrators are typically made of relatively low-cost materials (as compared with reflective concentrators for example) and are less visually intrusive.

There are, however, several problems with this form of absorptive-emissive or luminescent radiation concentrator, associated with the difficulty in finding suitable fluorescent dyes as absorbing materials. Several requirements have been identified for effective and efficient radiation concentration using absorptive-emissive systems. The absorbing material must be capable of: efficiently absorbing across the range of wavelengths of the incident radiation; emitting radiation at a wavelength suitable for absorption by the energy converter (e.g. photovoltaic element); emitting radiation with a high quantum yield (by which it is meant the ratio of the number of emitted to absorbed photons is close to unity); and not re-absorbing emitted radiation as it propagates through the waveguide. It is also required that the radiation absorber remains stable under solar illumination.

Typical organic fluorescent dyes having broad band absorption and emission have absorption and emission spectra which have significant levels of overlap, which results in re-absorption of emitted radiation. Re-absorption of emitted radiation reduces the efficiency for at least two reasons: when the re-absorbed radiation is again re-emitted, the quantum yield of the absorption-emission process results in a small loss if it is not unity; and up to approximately a further 30% is lost by being re-emitted in a direction which avoids total internal reflection by the waveguide. The latter loss arises because when re-emission occurs, the direction of propagation of the original light is lost and light is emitted in random directions resulting in the said further 30% loss of radiation from the system. If, on average, several of these interactions occur as light propagates from the centre of a luminescent planar concentrator to the edge, the intensity will be significantly reduced. This mechanism is the greatest source of loss in an LPC and restricts the size (and therefore benefit) of planar concentrators. This may have the effect of reducing the area of effective solar collection to areas close to the edge of the radiation receiver (luminescent planar concentrator) near the PV element.

Many attempts have been made to address this problem by selection of luminescent, typically fluorescent, dyes having a large Stokes shift (i.e. the wavelength difference between peak absorption and peak emission in the spectra). Whilst the Stokes shift in principle reduces the risk of reabsorption and increases the mean free path of re-emitted radiation, there typically remains a degree of overlap which limits the size of the concentrator that is possible before reabsorption/re-emission losses become significant.

There have been several attempts to overcome the difficulties associated with such fluorescent absorptive-emissive systems.

For example, in U.S. Pat. No. 4,110,223, there is described a multiple layer collection device, each layer acting as an independent solar concentrator and doped with a separate fluorescent dye having a relatively narrow bandwidth of absorption and a narrow emission bandwidth. By this method the effective absorptive bandwidth of the multiple layers covers a broad range of wavelengths. However, the disadvantages with this method are that the edge-mounted PV element is required to be three times the size (to cover three edges) and it is difficult to identify appropriate fluorescent dyes that absorb at different wavelengths but emit at the same narrow wavelength suitable for the PV element whilst meeting the other requirements of transparency, photo-stability, high Stokes shift, etc.

U.S. Pat. No. 4,188,239 describes a solar concentrator comprising a planar waveguide at least one edge of which impinges upon a photovoltaic cell, the waveguide comprising an active luminescent species responsive to a portion of the incident solar radiation to generate luminescent radiation trapped within the waveguide and delivered to the photovoltaic cell by total internal reflection. The device further comprises a backing layer comprising a mirror having deposited thereon a rough, diffusing layer of particulate solid inorganic phosphorescent material, activated by the shorter wavelength solar radiation not absorbed by the luminescent species in the waveguide. The phosphorescent material produces on activation a longer wavelength emission that is reflected back into the waveguide and is of a wavelength that may activate the luminescent material therein. The specific example described uses the reflective phosphorescent particulate layer to reintroduce transmitted incident radiation into the waveguide at a longer wavelength, whilst the waveguide contains two fluorescent materials for generating the fluorescence to be captured by the photovoltaic cell. Whilst this solution assists in re-capturing incident radiation outside the spectrum of activation of the luminescent material contained within the waveguide, the luminescent material itself, which in the specific example is sulforhodamine 101 organic fluorescent dye, remains unsatisfactory for use in the waveguide in that there is insufficient separation between the absorption and emission spectra, which leads to an unsatisfactory overlap and significant re-absorption.

A further problem with fluorescent dye-based systems has been the tendency for the dye to degrade over time due to exposure to solar ultraviolet light, although some efforts to identify more stable fluorescent dyes have been made.

U.S. Pat. No. 6,476,312 (Barnham et al) attempts to overcome the shortcomings of absorptive-emissive radiation concentrators that use organic fluorescent dyes as the absorbing materials and describes a radiation concentrator for use with a photovoltaic device, which comprises a wave-guide containing a plurality of quantum dots. The quantum dots cause a red-shift of incident radiation which is internally reflected by the waveguide to a waveguide output. Quantum dots are said to be of particular benefit due to their luminescent efficiency and the tenability of absorption thresholds and size of red shifts. The use of quantum well cells can tune the bandgap. According to U.S. Pat. No. 6,476,312, by incorporating quantum dots of a certain spread of sizes, the red-shifted radiation can be controlled to minimise overlap with the absorption spectrum and match the required bandwidth of the photovoltaic element. Whilst quantum dots possess the characteristic of suitable broad-band visible absorption and narrow band emission, they suffer from the common characteristic of small Stokes shift, which reduces the path length of emitted radiation due to re-absorption. Whilst efforts to increase that path length via controlling the spread of size of quantum dots have been described, the practical efficiency has yet to be demonstrated (e.g. Gallagher et al, Solar Energy 81 (2007) 813-821), the assumption being that whilst a spread of dot sizes increases the red shift of the absorption and emission peaks, the absorption spectrum becomes broader providing some overlap with the emission spectrum.

It would be desirable to provide a luminescent or absorption-emission concentrator system having improved efficiency and which addresses the problem or reabsorption of radiation within the device and which thereby improve PIT absorption efficiency whilst overcoming the problems with prior art systems.

Problem to be Solved by the Invention

It is an object of the invention to improve the efficiency of radiation concentration devices such as luminescent planar concentrators.

It is a further object of the invention to provide an optical means for improving concentrator efficiency and in particular addressing the 'reabsorption' problem.

It is a still further object of the invention to provide a means for improving the efficiency of an existing luminescent concentrator by retrofitting an optical device.

The inventor has found a method and device to recapture light lost from the surface of a luminescent planar concentrator and reintroduce it or direct it to an edge-mounted radiation receiving device thereby improving the efficiency of the concentration.

SUMMARY OF THE INVENTION

Accordingly, in a first aspect of the invention, there is provided a radiation concentrator device comprising at least one concentrator element and at least one recapture element, wherein the at least one concentrator element comprises at least one transmissive surface for receiving radiation into the element and at least one concentration point for positioning a radiation receiving device to which point radiation may be directed by multiple reflections; and wherein the at least one recapture element, which is disposed in optical arrangement with the at least one transmissive surface of the concentrator element, comprises at least one concentration point for receiving recaptured radiation and is configured to a. transmit incident radiation to the concentrating element, b. re-capture by optical means escaped radiation from the concentrator element; and c. redirect at least a portion of the escaped radiation to the at least one concentration point.

In a second aspect of the invention, there is provided photovoltaic device comprising a radiation concentrator device as defined above and one or more photovoltaic cell or array of photovoltaic cells.

In a third aspect of the invention, there is provided a method of enhancing the concentration efficiency of a luminescent planar concentrator, the method comprising the steps of providing a luminescent planar concentrator having at least one planar surface and at least one edge and having disposed on the at least one edge a radiation-receiving device and disposing on at least one planar transmissive surface a radiation re-capture element configured to transmit incident radiation to the concentrating element, to re-capture by optical means escaped radiation from the luminescent planar concentrator and to redirect at least a portion of the escaped radiation to a radiation receiving device.

In a fourth aspect of the invention, a system including a radiation concentrator device comprises an optical lighting film including a planar surface and a corrugated surface disposed in optical arrangement with a transmissive surface of the radiation concentrator device.

In a fifth aspect of the invention, a system including a solar radiation concentrator including a luminescent concentrator element having an incident radiation receiving surface comprises a recapture element comprising a first planar surface and a second, microgrooved, surface, the microgrooved surface including a plurality of substantially parallel grooves, on a planar surface, defining an apex angle substantially equal to a right angle, the recapture element being positioned on the incident radiation receiving surface of the luminescent contractor element in a configuration whereby the first planar surface is adjacent the incident radiation receiving surface of the luminescent concentrator element and whereby the groove direction is substantially normal to the plane of the sun's trajectory through the course of a day.

In a sixth aspect of the invention, there is provided a solar concentrator system comprising a luminescent planar concentrator element having a planar transmissive surface for receiving radiation into the element and at least one concentration point to which point received radiation may be directed by the element, and a recapture element, the recapture element comprising a sheet element having an inner planar transmissive surface placed adjacent to and in optical arrangement with the transmissive surface of the concentrator element and having an outer grooved surface comprising a plurality of parallel grooves having an apex angle substantially equal to a right angle, said recapture element provided with at least one concentration point, whereby radiation emanating from the concentrator element and captured by reflection from the outer surface of the recapture element may be directed to the concentration point by the arrangement of the surfaces of the recapture element, wherein the system in use is positioned such that the groove direction is substantially parallel to the plane of the trajectory of the sun through the course of a day.

Advantageous Effect of the Invention

The invention enables recapture of radiation that has escaped from radiation concentrator devices and more particularly from luminescent planar concentrators (LPC). It finds particular application in addressing the 'reabsorption' problem in which losses to an LPC system can arise due to the random nature of re-emission of radiation from luminescent dyes leading to up to 30% of re-emitted radiation escaping the device on each occasion. The invention enables the capture and retention within the device of a substantial proportion of that escaped radiation.

DETAILED DESCRIPTION OF THE INVENTION

Figure 1:
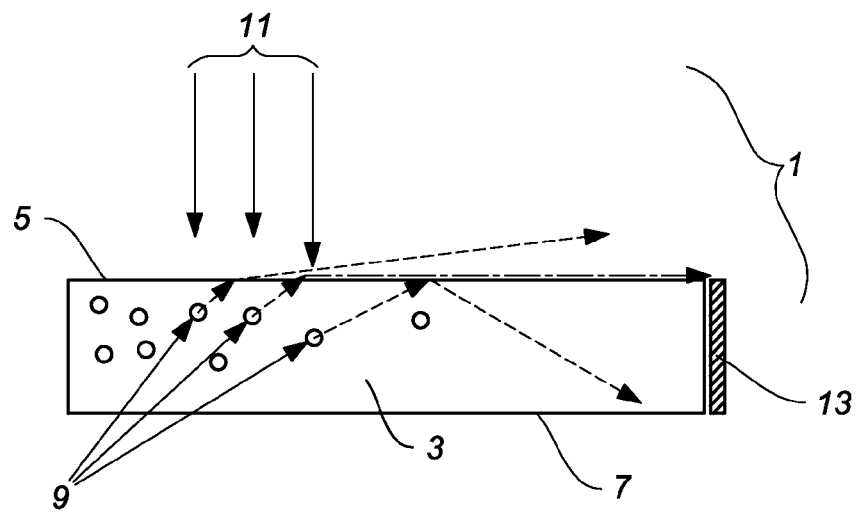
FIG. 1 is an illustration of a luminescent planar concentrator (LPC) of the prior art

According to the present invention a radiation concentrator device comprising a concentrator element for concentrating radiation received on its transmissive radiation-receiving surface to a concentrating point, typically the edge of a sheet element, may demonstrate improved efficiency by having provided in optical arrangement with the transmissive radiation-receiving surface of said concentrator element a recapture element, which recapture element is characterized by being transmissive to incident radiation destined for the concentrator element and by the ability to re-capture radiation emitted from the concentrator element, typically by optical means.

The concentrator element preferably comprises a radiation-absorptive material, such as a luminescent material, capable of absorbing incident or solar radiation and re-emitting radiation preferably spectrally shifted from the absorbed radiation.

The recapture element is preferably defined as having a first, concentrator transmissive, surface (or inner surface), which may be placed in optical arrangement with the surface (typically planar surface) of a concentrator element, and a second, radiation receiving, surface (outer surface) through which incident radiation may be received and transmitted to the concentrator element. When radiation escapes from the concentrator element, it is this radiation receiving surface arrangement that enables the recapture function, whereby at least a portion of escaped radiation may be retained within the radiation concentrator device by reflection (e.g. total internal reflection) within the recapture element and either re-transmission to the concentrator element or propagation along the medium of the recapture element to a concentration point (for receiving concentrated radiation).

Whilst any arrangement that achieves an optical recapture effect may be incorporated into the device as the recapture element within the scope of the invention, preferred arrangements are where recapture is provided by total internal reflection of escaped radiation against the internal face of the incident radiation transmissive surface (also referred to herein as the 'outer surface'), which preferably has undulating or corrugated surface characteristics. For example, the incident-radiation transmissive surface may comprise a plurality of ridges and grooves defined by the junctions of a series of planar surfaces each disposed at an angle to the next (to form a ridge or a groove), which ridges and grooves are preferably substantially parallel and which ridge- and groove-defining planar surfaces are two sets of parallel surfaces.

The angles at which the planar surfaces in the series are disposed relative to one another will determine the angle of the ridges and grooves, which is preferably from 75° to 105° and more preferably a right angle.

By optical arrangement, it is meant that the elements are arranged such that radiation may pass from one element to another and is preferably meant that the limits of transmission angle of the surface of the concentrator element are within 10°, more preferably within 5°, of the limits of transmission angle of radiation incident upon a surface of the recapture element placed in optical arrangement with the surface of the concentrator element.

Preferably the radiation-receiving surface of the concentrator element and the surface of the radiation recapture element are in intimate contact or separated by a short distance (e.g. up to 5 mm, preferably up to 2 mm).

It is preferred that the concentrator element and the radiation recapture element are formed of materials such that the refractive index of the concentrating element is equal to or greater than that of the recapture element and more preferably the refractive indices of each of the elements is similar (e.g. within 10%) and most preferably the same.

The invention finds particular utility when used with a radiation concentrator element having a planar surface for receiving radiation, e.g. a planar sheet radiation concentrator element. When the radiation concentrator element is a planar sheet radiation concentrator element, the point or points of concentration of radiation are preferably at the sheet edges.

In a preferred embodiment, the radiation concentrator element is a luminescent radiation/solar concentrator.

Preferably, the radiation concentrator is fitted with one or more photovoltaic devices at its concentration point(s), e.g. a strip of photovoltaic material positioned in optical arrangement with one or more edges of a sheet radiation concentrator element and one or more edges of a recapture element.

As discussed above, a major problem with luminescent planar concentrators is the 'reabsorption problem', where the mean free path of a photon of radiation is such that it is likely to get reabsorbed by another radiation absorbing moiety before it reaches the collection point. One problem with repeated reabsorptions is that even if the absorption-emission cycle is relatively efficient, the direction in which re-emissions are propagated is random and so each reabsorption cycle results in a proportion of re-emission being lost back out through the incident receiving surface.

A benefit of the invention is that much of that lost radiation is captured and redirected back into the concentrator element or is propagated within the recapture element to an associated radiation concentration point.

The concentrator device according to a preferred embodiment of the invention comprises a planar luminescent concentrator element having two planar surfaces one, a first planar transmissive surface, is for receipt of incident solar radiation, which concentrator element is doped with a luminescent material (or with quantum dots) capable of absorbing radiation in the visible, and optionally infra-red and ultraviolet wavelengths and reabsorbing at a desired wavelength. Preferably the concentrator element is provided with a photovoltaic element at one or more sheet edges or portions thereof as a concentration point which photovoltaic element is selected to efficiently absorb radiation at the wavelength emitted by the luminescent material. The concentrator element is provided, in optical arrangement, on its radiation receiving surface with a recapture element as described above. On the other (second) planar transmissive surface, the concentrator element may be provided with a second recapture element or a reflecting means, such as a mirror, for directly reflecting escaped radiation back into the concentrator element. The second recapture means or reflecting means has no requirement to be transmissive to incident radiation.

Preferably, the concentrator element of the device contains a radiation-absorptive (e.g. luminescent) material capable of absorbing incident radiation (e.g. solar radiation) and re-emitting it, whereby it may progress along the concentrator element by internal reflection as a waveguide (this may be denoted an inner waveguide in the radiation capture device of the invention) to the edges or other concentrating point, where a PV cell is provided receptive to said re-emitted radiation. The radiation-absorptive material is preferably luminescent material such as a luminescent dye, in a preferred embodiment of the invention.

The luminescent material may comprise, for example, one or more fluorescent dye(s) or one or more phosphorescent dyes, or a mixture thereof.

If a fluorescent dye is used in the concentrator element it is preferably a fluorescent dye having separated absorption and emission maxima (i.e. a large stokes shift) and minimal overlap between its absorption and emission spectra and a high quantum yield in its absorption-emission cycle, e.g. of at least 0.5, more preferably at least 0.9 and most preferably at least 0.95.

In a preferred embodiment, the luminescent material comprises a phosphorescent dye, having an emission spectrum spectrally separated from its absorption spectrum. Phosphorescence is herein defined as any luminescence arising from an optical transition between two states of different electron spin multiplicity, for example in neutrally-charged organic molecules, like benzophenone, between the lowest-lying triplet state ($T_1$) to the ground state singlet ($S_0$), or of $Cr^{3+}$ in ruby from the lowest-lying doublet states ($^2E$, $^2T_1$) to its ground state quartet ($^4A_2$), or in $Eu^{3+}$ complexes, the emission from the excited ($^5D_0$) state to its ($^7F_2$) ground state. Phosphorescent dyes for use in the present invention may exhibit any such phosphorescent luminescence, but those arising from triplet-singlet transitions (e.g. $T_1$-$S_0$) are preferred. Preferably the radiation-absorptive material comprises high quantum yield phosphorescent dye with a phosphorescence sufficiently spectrally shifted from the absorption characteristics of the material. With such efficient phosphorescent dyes, fluorescent emission is disadvantaged by an efficient intersystem crossing and the phosphorescent emission dominates. In neutral organic molecules, for example, where phosphorescence originates from the lowest lying triplet excited state, the net absorption-emission spectral shift is enhanced by an extra contribution arising from the $S_1$-$T_1$ energy gap, which typically lies in the range of 2000-8000 $cm^{-1}$ (translating to about 40-200 nm within the visible region). Overlap between absorption and emission is thus markedly reduced and reabsorption of the phosphorescent emission becomes negligible. Thereby, the effective collection area on a sheet solar collector delivering concentrated radiation to the edges is significantly increased (and thus the effective concentration effect is improved).

By sufficiently spectrally shifted from its absorption spectrum, it is meant the peak of the shifted emission spectrum is shifted from the peak of the absorption spectrum such that the overlap of absorption spectrum of the dye and its phosphorescent emission spectrum is minimised. Preferably, the absorption and emission maxima are separated by at least twice the sum of the half-width half-maximum (HWHM) values of the facing halves of the absorption and emission envelopes. More preferably the separation should be at least three times the sum of the HWHM's.

In the embodiment of the invention in which a photovoltaic element is coupled with the radiation concentrator and the response of the coupled photovoltaic element is closely matched to the emission spectrum of the dye, practical minimisation of re-absorption may be calculated to take into account the extinction coefficient of the dye as a function of wavelength, the concentration of the dye in the absorbing medium, the relative intensity of the dye's emission as a function of wavelength and the distance from all points of absorption within the area of the absorbing medium to the edge-lining solar cells. An approximation of the fractional loss due to re-absorption is given by:

loss factor~$1-[\int 10^{-\epsilon(\lambda).c.L}.I(\lambda).(\lambda^{-2}).d\lambda / \int I(\lambda).(\lambda^{-2}).d\lambda]$ wherein the integrations are over the wavelength range of the emission, $I(\lambda)$ is the relative intensity of the emission as a function of wavelength, $\epsilon(\lambda)$ is the molar extinction coefficient ($M^{-1}$ $cm^{-1}$) of the dye's absorption as a function of wavelength c is the molar concentration of the dye in the medium of the concentrating element and L is a mean distance (cm) approximated as the distance from the centre of the medium area to its edge.

The loss factor is thus dependent on the overall area of the medium.

Based on this approximation to loss factor in the system, the degree of overlap of the absorption and emission spectra of any particular phosphorescent dye (or dye system) for use in accordance with the present invention is preferably such that the loss factor is 0.5 or less, more preferably, 0.3 or less, still more preferably, 0.1 or less and most preferably 0.05 or less.

If the emission profile is not perfectly matched to the response of photovoltaic element, then any overlap of the absorption and emission spectrum contributing to the re-absorption loss factor occurring within the response bandwidth of a coupled photovoltaic element is preferably minimised by the means referred to above, and still more preferably, there is no overlap of absorption and emission spectrum contributing to the loss factor at wavelengths matched to the response of a coupled photovoltaic device.

When coupled to a photovoltaic element, the concentrator device and PV element are configured such that the response of the PV element matches at least a portion of the phosphorescent emission spectrum. Preferably, the PV element is responsive across at least 50% of the emission spectrum at half width half maximum, more preferably at least 75% and still more preferably at least 90% and most preferably totally matched. To the extent to which the PV element response is configured to match the phosphorescent emission of the dye system, the loss factor in the system is preferably, 0.5, 0.3, 0.1, 0.05, and most preferably substantially no loss due to re-absorption occurs at the wavelength of the phosphorescent emission to which the PV element is responsive.

Any suitable such photophosphorescent material may be used as the photoluminescent dye. By photophosphorescent material as used herein it is meant a photoluminescent material that exhibits phosphorescence. The photo-phosphorescent material is preferably chosen to match the required radiation output, for example a wavelength of response of the chosen photovoltaic element used to capture and convert the concentrated radiation. Ideally, the radiation-absorptive material, e.g. photoluminescent material such as a photophosphorescent material, used in the concentrator of the present invention is stable to illumination (especially actinic radiation), has a high quantum yield, has an emission spectrum that can be energy matched to a coupled photovoltaic element and an absorption spectrum that is substantially spectrally separated from its emission spectrum (e.g. by at least twice the sum of HWHMs of the respective spectra). Preferably, it is a photophosphorescent material that has an absorption spectrum that is capable of absorbing solar radiation and preferably a substantial portion of the spectrum of solar radiation.

Preferably, the photophosphorescent material is a phosphorescent organometallic dye.

The quantum yield of the photophosphorescent material is preferably 0.1 or more, more preferably greater than 0.3, still more preferably greater than 0.5 and most preferably greater than 0.8. Where available and subject to the suitability for use in such a system, the most preferred photophosphorescent materials are those with a quantum yield of 1 or within 10% thereof. Suitable such photophosphorescent materials are typically characterised by strong singlet-singlet absorption (or a similarly spin-allowed absorption), efficient intersystem crossing to the triplet state manifold (or similar manifold having a different electron spin multiplicity to the states involved in the absorption) and exhibiting a high quantum yield of phosphorescent emission. Any absorption between the states involved in the phosphorescent emission in suitable phosphorescent materials, i.e. singlet ground state to triplet excited state for most organic molecules, is typically very weak whereby self-absorption of emitted energy is minimised.

Preferred classes of photophosphorescent materials for use in accordance with the present invention include main group, transition metal and lanthanide coordinating complexes, having the general formula $(M)_p (L)_q$, wherein (M) may be a heavy metal atom or ion, p may be equal to or greater than 1, and (L) is a ligand system, wherein q may be equal to or greater than 1, comprising one or more single- (L) or multidentate (L^L^ . . . ) organic ligands bound to metal. For p>1, the metals may be the same or different and the ligands may bind to the same or different metal atoms or ions.

Preferably, M may be chosen from third row transition metals (atomic numbers from 72 to 79), especially rhenium (I), osmium(II), iridium(III) platinum(II) and gold(I), i.e. complexes of isoelectronic metal ions with $d^6$, $d^8$ and $d^{10}$ electron configurations. Examples of useful third row transition metal complexes include: rhenium(I) complexes such as tricarbonylrhenium(I) α,α'-diimine complexes (e.g. [Re(N^N)(CO)$_3$(L)]$^{n+}$, where N^N is the diimine ligand, L is a monodentate ligand and n is 0 or 1, and those where L is an acetylide moiety; biscarbonylrhenium(I) α,α'-diimine complexes (e.g. bipyridine coordinated complexes such as cis-, trans-[Re(X$_2$bpy)(CO)$_2$(PR$_3$)(Y)]$^{n+}$ where X is Me, H or CF$_3$, R is OEt or Ph, Y is halogen or pyridine); or tetracabonylrhenium(I) complexes Re(CO)$_4$L; osmium (II) complexes, such as simple osmium (II) α,α'-diimine complexes which emit in the far red/near IR region and have high quantum yields, are of the form Os(II)(N^N)$_2$(L^L) or Os(II)(N^N)$_2$L$_2$ or Os(II)(N^N)(L^L)AB where N^N is e.g. phenanthroline or bipyridine or other α,α'-diimine, L^L is a bidentate ligand coordinated through phosphorus or arsenic atoms, or L may be an isolated phosphorus or arsenic coordinating ligand and A, B may be, e.g. carbonyl and halogen;

iridium (III) complexes, which span the phosphorescence quantum yield range of 0.1 to 0.9, and useful emission wavelength range of 470-640 nm, having the general formulae Ir(III)(C^N)$_{3-n}$(L^'L'')$_n$ or Ir(III)(C^N)$_{3-n}$L$_{2n}$, wherein n=0, 1, or 2, (C^N) is a 2-phenyl azaaromatic molecule, e.g. variously substituted 2-phenyl pyridine, 2-phenyl quinoxaline, 2-phenyl benzthiazole, etc., (L'^L'')$_n$ may be a ligand containing two coordinating centres such as N, O, etc. which may be the same as in acetylacetone or bipyridyl or different, or in the case of supplementary monodentate ligands L may be, e.g. CN, SCN, NCO as in M. K. Nazeeruddin et al, J. Am. Chem. Soc. 125, 2003, 8790. Interlinking two iridium centres using extended phenylpyridyl moieties, as in P. Coppo et al, Chem. Com. 15 2004, 1774, are also known to exhibit substantial quantum yields;

platinum (II) complexes, which also span the phosphorescence quantum yield range 0.1 to 0.9, mostly emit in the range 550-650 nm, and generally involve at least one cyclometalated multidentate ligand in coordination modes (e.g. N^N, N^N^C, C^N^C, N^C^N, N^N^N, N^N^N^N, N^N^C^C, S^S, S^C^S). High quantum yield porphyrins as in D. L. Eastwood et al, J. Mol. Spectrosc. 35, 1970, 359 are amongst the earliest known examples; other quadridentate examples as in J. Kavitha et al, Adv. Funct. Mater. 15, 2005, 223 and Sandrini et al, J. Am. Chem. Soc. 109, 1987, 7720; tridentate—with other monodentate ligands, as in J. A. G. Williams et al, Inorg. Chem. 42, 2003, 8609 and Q.-Z. Yang et al, Inorg. Chem. Comm. 41, 2002, 5653, and bidentate—with other monodentate—and bidentate ligands, as in J. Brooks et al, Inorg. Chem. 41, 2002, 3055; and gold (I) complexes, especially wherein the mononuclear complexes containing carbine, phosphine, thiolate and acetylide exhibit weak intra-ligand phosphorescent states in the 400-500 nm region, and a few examples of ligand to metal charge transfer states emitting in the 600-700 nm region, as in J. M. Forward et al, Inorg. Chem. 34, 1995, 6330, more generally weak intermolecular bonding leads to numerous di- tri- and polynuclear examples.

In another preferred embodiment, the photoluminescent material comprises a transition metal complex, which is optionally heterometallic. In general, at least one of the metals involved is taken from the prominent third row transition metals (rhenium(I), osmium(II), iridium(III), platinum(II) and gold(I)) and the other partner metals may belong to the first, second or third transition series, or the lanthanide series.

Phosphorescent chromophores incorporating the heavy metals described in the paragraphs above may also be incorporated as a core into dendrimers and other oligomeric structures which find utility in the systems according the present invention. Phosphorescent polymers—in contrast to simple blending of the above chromophores and conventional polymer hosts—may facilitate solution deposition, reduce unstable phase behaviour over longer term usage and protect against adverse photochemistry. These have the general structure of a conventional polymer backbone with a repetition of one or more attached pendant groups, at least one of which will have the form of the phosphorescent chromophores incorporating the heavy metals described in the paragraphs above.

One example of a suitable photophosphorescent dye for use in the concentrator element of the device according to the present invention is tris[2-phenylpyridinato-C2,N]iridium (III), also known as Ir(ppy)$_3$.

Preferably, for efficient phosphorescence, the material emits at the red end of the visible spectrum, preferably 550-750 nm, more preferably 600-700 nm, most preferably 650-700 nm.

The portion of the visible spectrum not covered by the phosphorescence is preferably covered by the formally-allowed absorption, and more preferably with one or more additional dyes, whose fluorescence overlaps strongly with the allowed absorption band of the phosphorescer, and whose concentrations facilitate efficient energy transfer to the phosphorescent dye.

Optionally, a mixture of photoluminescent dyes can be provided as the radiation-absorptive material of the concentrator element according to the present invention. In this case, the mixture of dyes is preferably selected such that cumulatively there is a broad band of absorption in the visible region of the spectrum to enable a large proportion of the incident radiation to be absorbed across a range of wavelengths of actinic light, with a peak absorbance preferably in the shorter wavelength part of the spectrum and such that there is a narrow band emission spectrally separated from the region(s) of absorption, which should closely match the response of any associated radiation capture device such as a photovoltaic element.

The mixture of photoluminescent dyes may comprise a photophosphorescent material, which provides the spectrally separated emission and a second material, which may be a fluorescent dye, responsible for absorption of incident radiation. Ideally, the second material is such that in isolation it will emit at wavelengths with a high quantum yield of fluorescence closely matching the wavelength of excitation of the photophosphorescent material. In the presence of the photophosphorescent material, concentration conditions may be arranged to promote efficient resonant energy transfer, as described in T. Förster, "Fluorescenz Organische Verbindungen" Göttingen: Vandenhoech and Ruprech, 1951, to the singlet excited state of the photophosphorescent dye, without any intermediate fluorescent emission, and concomitant reabsorption attenuation. Preferably, the second material's emission and the wavelength of excitation of the photo-phosphorescent material is in the visible spectrum at a part of the spectrum where the second material absorbs relatively weakly whereby incident radiation can be absorbed by either or both the phosphorescent material and the second material, thus extending the effective spectral capture of the incident radiation. The phosphorescent material may be selected according to these criteria from any of the classes referred to above.

In one embodiment, the radiation-absorptive material of the solar concentrator may comprise a mixture of at least two materials, an incident-absorptive component and a product-emissive component. The incident-absorptive component may be characterised in that in the absence of the product-emissive component, it will emit a high quantum yield of fluorescence at wavelengths closely matching the wavelengths of absorption of the product-emissive component, whilst in the presence of the product-emissive component concentration conditions may be optimised such that efficient resonant energy transfer, as described in T. Förster, "Fluorescenz Organische Verbindungen" Göttingen: Vandenhoech and Ruprech, 1951, to the singlet excited state of the product-emissive component preferentially occurs. The peak of the quenched fluorescence emission of the incident-absorptive component should closely match the peak absorption of the product-emissive component to provide optimal overlap of the two profiles. The radiation-absorptive material according to this embodiment may be further characterised by the overall absorption of the incident-absorptive component and product-emissive component having a combined broader-band absorption capture of incident radiation, preferably in the visible spectrum, and the product-emissive component having a narrow band emission (product-emission) spectrum spectrally separated from the overall absorption spectrum. By this means, product emissions do not run the risk of being reabsorbed by either the incident-absorptive component or the product-emissive component, whilst the system is capable of broad-band visible absorption and narrow band emission at a wavelength to which the associated radiation capture device, e.g. PV element, is particularly responsive.

The incident-absorptive component may be chosen from any material which displays a significant visible absorption spectrum and a narrow band emission spectrum, the peak absorption and peak emission being spectrally separated. Under conditions of efficient resonant energy transfer, it is not required according to this aspect of the invention, that overlap of the absorption and emission spectra of the incident-absorptive component be avoided, merely that the material displays an intense, narrow-band emission spectrum spectrally separated from the peak absorbance wavelength. Accordingly, the incident-absorptive component may be provided by a fluorescent dye having one or more absorptions in the visible region and a narrow band emission and high quantum yield, or by an array of quantum dots having broad-band absorption and narrow band emission shifted relative to the peak of absorption. Suitable quantum dot configurations include, for example that described in U.S. Pat. No. 6,676,312, the disclosure of which is incorporated herein by reference in this context.

The product-emissive component may be chosen from any material which displays an absorption spectrum having a peak closely matching the narrow band emission spectrum of the of the incident-absorptive component and having a narrow band emission spectrum spectrally shifted with respect to the absorption spectra of both the product-emissive component and the incident-absorption component. The intermediate absorption may be a narrow band absorption. Suitable materials include photoluminescent materials, such as phosphorescent materials and fluorescent material. Suitable phosphorescent materials include those described above in relation to the other aspects of the present invention. Suitable fluorescent materials include those having narrow band absorption and emission spectra but characterised by large Stokes' shifts.

In a preferred embodiment of this aspect of the invention, the product-emission spectrum has minimal overlap with the absorption peaks of the components of the absorbing material, preferably amounting to losses of 5% or less of the total absorption intensity, more preferably 1% or less and still more preferably 0.2% or less of the total absorptive intensity of the absorption spectra of the incident-absorptive component and the product-emissive component.

As a further option, the radiation-absorptive material may comprise a photophosphorescent dye embedded into the concentrator element and a thin, but separate layer of a broad-spectrum absorbing fluorescent dye having an emission matching that of the photophosphorescent dye, the layer of fluorescent dye being formed within the concentrator element or coated on the surface thereof, between the concentrator element and the recapture element for example, whereby the fluorescent dye absorbs incident radiation and emits fluorescence radiation that may be absorbed by the phosophorescent dye which emits emissive radiation suitable for use in the radiation capture device (e.g. of a bandwidth of response of an associated photovoltaic element).

As mentioned above, in a planar concentrator element 70% of the emissive radiation is typically maintained within the element, so that 30% is routinely lost by passing out of the element again, a portion of which is intended to be captured by the recapture element of the radiation concentrator of the invention. Accordingly, further means may be adopted to minimise the lost emissive radiation. In one embodiment described in the prior art, emissive losses may be minimised by incorporating a luminescent material within an aligned polymer arranged within a concentrator element to minimise losses of incident radiation and emissive radiation. In an optional embodiment according to the present invention, there is provided a photophosphorescent dye disposed on an aligned polymeric material and incorporated into the concentrator element such as to minimise transmission losses of emissive radiation as described in WO-A-2006/088370, the general and specific disclosures of which are incorporated herein in relation to the incorporation of photophosphorescent dyes.

Optionally, a reflective element may be disposed on the side or sides of a concentrator element not subject to incident radiation to reflect back into the concentrator element any unabsorbed incident radiation, the reflective element optionally having disposed thereon a layer of photoluminescent material, e.g. particulate photoluminescent materials for generating diffuse light, which emits radiation at a wavelength closely matching the peak absorption of the embedded photoluminescent material.

The radiation-absorptive material, especially a photophosphorescent dye, may be embodied within the concentrator element by, for example, forming a coating of the radiation-absorptive material on an outer surface of the concentrator element material, the coating having a refractive index similar to that of the concentrator element itself, by forming one or more layers of radiation-absorptive material within the concentrator element and/or by doping the radiation-absorptive material, e.g. a phosphorescent dye and optionally any other components of the radiation-absorptive material into the concentrator element during its formation. Accordingly, the radiation-absorptive material and especially a phosphorescent dye may be incorporated into the concentrator element by means of one or more of doping, layering or coating.

The radiation-absorbing material, e.g. luminescent dye, may be doped into the concentrator element by any suitable means depending upon the nature of the luminescent dye and the material of the element, but in any case would be expected to be incorporated during the formation of the element. For example, in the manufacture of a sol-gel type glass concentrator, the luminescent dye may be incorporated as a solution or dispersion in an aqueous solution of silicate salt which is then cured by acid precipitation and dehydration.

Alternatively, the radiation-absorbing material, e.g. luminescent dye such as a phosphorescent dye, may be incorporated by coating it on a surface of the concentrator element. For example, the dye may be coated directly onto the surface of the concentrator as a solution or dispersion in a suitable binder having a refractive index similar to that of the concentrator material itself, or it may be formed as a layer on one or both surfaces of a plastic film which may be then adhered to one or more surfaces of the concentrator, or alternatively the dye may be dispersed within a plastic film adhered to the surface of the concentrator. When formed as a photophosphorescent dye in a film coating, preferably an antioxidant is added to minimise oxidative degradation of the dye.

Alternatively or additionally, the radiation-absorptive material (e.g. luminescent dye) may be incorporated in one or more layers, of similar refractive index, which one or more layers make up a single concentrator element, and wherein more than one layer contains the dye, which layers may be adjacent or separated layers. Optionally, a layer comprising a dye may be formed by doping a layer of material used to make the concentrator element with the dye or dyes and adhering with other layers of the concentrator element during or after formation. Optionally, one or more layers of the concentrator element, e.g. an internal layer containing a photophosphorescent dye, is a liquid having substantially similar refractive index to other solid and any other liquid layers of the element. The liquid may be a solution or dispersion of the absorbing element and/or phosphorescent dye. Optionally, the radiation-absorptive material may be embedded into the concentrator element by one or more of these means.

Where the absorbing material comprises a phosphorescent dye and one or more further components, such as a further phosphorescent dye, one or more fluorescent dyes or a material comprising quantum dots (e.g. as a radiation funnel feeding the phosphorescent dye with appropriately tuned radiation), the various components may be incorporated in combination or separately or a mixture thereof, e.g. by each separately or various combinations of coating, layering or embedding the various combinations into the concentrator element. For example, where the absorbing system comprises a photophosphorescent dye, a layer of quantum dots and one or more fluorescent dyes of suitably selected absorption and emission spectra according to the present invention, they may be arranged such that the phosphorescent dye is incorporated as a doped middle layer of the a three layer concentrator element, the quantum dots (which may be selected as appropriate in the manner described in U.S. Pat. No. 6,476,312, the disclosure of which is incorporated herein by reference) are formed in a separate layer of the concentrator element and the fluorescent dye(s) are incorporated by coating them on the surface of the concentrator element in a suitably selected binder material, or in any other arrangement.

Any suitable medium may be used as the material of the concentrator element. One kind of concentrator material is a transparent plastic, such as an acrylic, polyurethane or polystyrene, preferably doped with the radiation-absorptive material. Another type of material is a "sol-gel" glass doped with radiation-absorptive material, e.g. a luminescent dye, the sol-gel glass being produced from an aqueous solution of silicate salt by acid precipitation and subsequent dehydration. Another type of material is a transparent low melting glass.

The concentrator element, and optionally therefore the inner waveguide, may be in sheet form, especially a planar sheet although curved panels and other configurations are considered to be within the scope of this invention, or, for example, in the form of a fibre optic cable.

Optionally, the concentrator element may be one or more rods of transmissive material. In this embodiment, the recapture element (which may be denoted as an outer waveguide in the radiation capture device of the invention) may be formed as a planar element provided on a plurality of aligned rods or may be formed as a cylindrical recapture element concentric with the rod concentrator element.

The media in any case should be largely transparent at the luminescent wavelengths. The material acting as host to the luminescent material (typically the medium of the concentrator element) and any additional dye is preferably a polymer or other glassy material which is transparent in the visible spectrum, and has no lower-lying electronic excited states than the lowest excited states of the dyes. Preferably such host material is characterised by a Tg (a measure of rigidity) greater than 60° C., preferably greater than 100° C., more preferably greater than 150° C. and most preferably greater than 200° C. and preferably has a Tg sufficient to guard against absorption of damaging levels of oxygen from the atmosphere into the medium. In this connection, it is preferable that the host material, or medium of the concentrating element according to the present invention, has an oxygen permeability of $10^{-2}$ g/m²/day or less, more preferably $10^{-4}$ g/m²/day or less and still more preferably $10^{-6}$ g/m²/day or less.

The medium of the concentrator element or host material should be transparent throughout the visible region. The medium may, for example, contain the radiation-absorbing and re-emitting dye system as a single layer of doped media on its own, in a layer sandwiched between two outer surface layers of transparent material or as or as a dyed material with the same or different refractive index sandwiched between two lower refractive index, substantially transparent layers which are only poorly transmissive over longer path lengths.

Preferably, the medium of the recapture element is the same as that of the concentrator element.

For use in conjunction with photovoltaic elements, the waveguide(s) and photovoltaic cells may be coupled via a taper of a transparent medium of higher refractive index, for example nanocrystalline diamond prepared by chemical vapour deposition, which may enable further useful concentration to be made further reducing the required size of photovoltaic element.

For use as a solar concentrator for photovoltaics, the concentrator should be coupled appropriately to a photovoltaic element (e.g. at one or more edges, preferably all edges, of a planar sheet concentrator element). Any suitable photovoltaic element may be used provided the emission spectrum of the photophosphorescent dye and the photovoltaic cell response are matched appropriately. Types of suitable photovoltaic element include for example bulk or thin film elements, e.g. silicon cells, GaAs multijunction cells, copper-indium selenide cells, cadmium telluride cells, solar cells comprising dye-sensitiser mesoporous materials, organic/polymer solar cells or nanocrystalline solar cells such as solar dot or solar well photovoltaic cells (quantum well solar cell such as that described in WO-A-93/08606). Preferred PV elements according to this embodiment are those that are most efficient (e.g. silicone PV cells) and closely responsive to the preferred phosphorescent wavelengths, e.g. 650-700 nm.

Any suitable size of element may be utilised, but the size should be selected bearing in mind that such losses due to efficiency of reabsorption emission cycles and loss through escaped radiation, even having the recapture elements described herein remain significant. In a preferred embodiment, however, the concentrator element is a planar transparent sheet (or slightly curved sheet) of up to 2 m² and preferably at least 0.01 m², more preferably, the element is of an area in the range of from 0.1 to 1 m², still more preferably up to 0.5 m² and most preferably up to about 0.3 m².

The preferred dimensions of the device, having regard to the above are as follows. Where a planar sheet concentrator element is utilized, it preferably has a depth (its shortest dimension) of 10 mm or less and preferably from 3 to 5 mm.

The radiation recapture element is preferably, as mentioned above, a sheet element having a planar surface for optical arrangement with the concentrator element and a grooved surface on the radiation receiving surface, which grooved surface preferably comprises 90° prisms running parallel along the surface. Preferably, the radiation recapture element comprises a sheet portion and a prismic portion, by which it is meant that the depth of the grooves is preferably less than the depth of the radiation recapture element, the prismic portion being defined by the depth of the grooves. Accordingly, the depth of the grooves is preferably in the range 5 to 500 μm, more preferably 10 to 250 μm and most preferably 25 to 100 μm. The non-prismic, or sheet, portion may range from 0 μm (i.e. the radiation recapture element consists essentially of prism elements) but preferably from 2.5 μm to 750 μm, more preferably from 5 μm to 100 μm and most preferably from 10 μm to 50 μm. In one embodiment, the radiation recapture element is provided by an optical lighting film (OLF), such as the polycarbonate OLF 2301 marketed by 3M, which is configured to be optically arranged with the concentrator element such that the prisms of the OLF are orientated away from the concentrator element.

When providing a solar PV concentrator, the device should be fitted with a photovoltaic element at the collection point (or radiation concentration points). Where fitted with a photovoltaic element at the collection point, it is preferable that the photovoltaic element is configured to overlap with the edge region of the concentrator element and the edge region of the radiation recapture element, provided that where the radiation recapture element comprises a plurality of grooves or parallel prisms, the photovoltaic element is configured on one or more edges perpendicular to said grooves or prisms.

As mentioned above, the concentrator element of the device of the invention may be denoted as an inner waveguide since it acts by internal reflection to propagate radiation emitted from its radiation-absorbing material to the concentration point (and optional associated photovoltaic device). The radiation recapture element may be denoted as defining an outer waveguide which is formed by the outer surface (being the corrugated or undulating radiation-incident surface) and either the inner surface of the recapture element (when radiation is propagated by internal reflection solely within the recapture element) or the opposing surface of the inner waveguide. The function of the outer waveguide in the context of the invention includes to redirect radiation escaping from the concentrator element (the inner waveguide) back into the inner waveguide, and to propagate radiation escaping from the concentrator element along the outer waveguide to a concentration point. By virtue of the radiation recapture element forming an outer waveguide, a substantial proportion of radiation escaping from the concentrator element is prevented from escaping from the radiation concentrator device altogether. According to this embodiment, radiation recaptured by the recapture element may propagate by internal reflection along the device in the direction of the grooves/prisms within the recapture element (i.e. internal reflection off the internal surfaces of the prism and the concentrator-facing surface) or within an outer waveguide formed by the prisms of the recapture element and a mirror or second recapture element arranged on the second planar surface of the concentrator element.

Accordingly, in a further aspect of the invention, there is provided a radiation concentrator element comprising an inner waveguide comprising a planar luminescent concentrator element as defined above and an outer waveguide comprising at least one recapture element comprising a plurality of prisms on the outer surface thereof which recapture element is in optical arrangement with one planar surface of the planar luminescent concentrator of the inner waveguide and optionally a mirror or second recapture element configured in optical arrangement with a second planar surface of the planar luminescent concentrator. According to this embodiment, radiation escaping from the inner waveguide (for example as a result of random emission direction in an absorption re-emission cycle), may propagate by reflection along the outer waveguide to a concentration point provided with, for example, a photovoltaic element.

In one embodiment, the exterior of the radiation capture element may be coated with a luminescent material (an exterior luminescent material), e.g. a phosphorescent or fluorescent dye material, that is poorly absorptive in the visible spectrum but efficiently overlaps the emission spectrum of the radiation-absorptive materials, being for example a fluorescent or a phosphorescent dye utilized in the concentrator element. In this way, even if the radiation capture element fails to capture the escaped radiation, it may be absorbed and a portion re-emitted into the device (due to the random emission direction of re-emitted radiation). The exterior luminescent material is preferably capable of efficient absorption-emission cycles (e.g. greater than 0.9, preferably unity). Optionally, the absorption spectrum and emission spectrum of an exterior luminescent material may overlap significantly (there is no particular requirement that overlap be minimized), it being preferable that the emission maximum of the exterior luminescent material be close to either the wavelength of absorption of an associated photovoltaic material or to the wavelength of absorption of the radiation-absorptive material in the concentrator element.

According to a preferred embodiment of the invention a dual waveguide structure is utilised with the LPC as the inner waveguide and the outer waveguide being used to capture the light lost from the LPC. According to this embodiment, a fraction of the light lost from the LPC propagates in the outer waveguide and is channeled to the edge of the structure where both light propagating in the LPC as well as light propagating in the outer waveguide are converted to electrical power on receipt by a photovoltaic element. Light enters the dual waveguide structure through a microgrooved transparent sheet which has the property of transmitting light incident on the microgrooved side but of reflecting a significant proportion of light incident from the other side.

In use, the device may be orientated to maximise the efficiency of solar energy capture through the outer surface of the recapture element. For example, the direction of the grooves in a recapture element may be arranged to be substantially aligned to or substantially normal to the plane of the trajectory of solar energy through the course of a day. In a preferred embodiment, the direction of the grooves is substantially normal to the plane of the solar trajectory. If the concentrator device for solar radiation collection is inclined at an angle to the horizontal, with the grooves arranged normal to the plane of the sun's trajectory, removal of any foreign objects or dirt trapped in the grooves may be enabled (e.g. when water is applied or when it rains). Optionally, the incident radiation receiving surface (the outer surface) of the recapture element is provided with a dirt-resistant material such as that used in the art in self cleaning glass and the like.

The invention will now be further described with specific reference to the Figures, by way of example only.

In FIG. 1 is shown a luminescent planar concentrator (LPC) element 1, as is known in the art, in the form of a planar sheet 3 having a first planar surface 5 for receiving incident radiation and a second planar surface 7. The LPC element 1 is provided with a radiation-absorptive material 9 which forms luminescent centres within the concentrator element 1, which material 9 absorbs incident radiation 11 (e.g. sunlight) and re-emits radiation in random directions. A proportion of the re-emitted radiation then propagates to a photovoltaic cell at the edge of the sheet 3 by total internal reflection against the first and second planar surfaces 5, 7. However, a substantial proportion of re-emitted radiation escapes by hitting the planar surfaces 5, 7 at less than the critical angle and being refracted out of the structure rather than being reflected at the surface.

Figure 2:
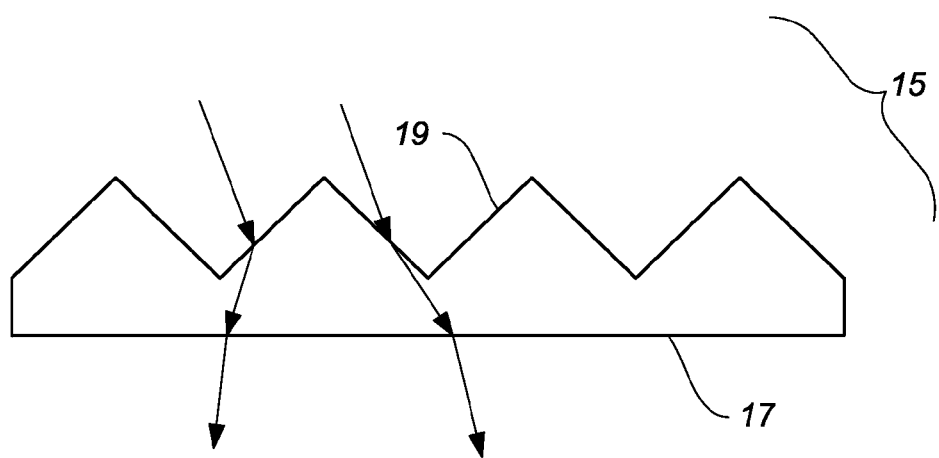
FIG. 2 is a diagram of a recapture element for use in accordance with the radiation concentrator device of the present invention.

In accordance with the invention, an outer waveguide or radiation recapture element 15 is shown in FIG. 2. The radiation recapture element 15 comprises a planar concentrator-transmissive surface (inner surface) 17 which may be disposed in optical arrangement with a first planar surface in a concentrator element of FIG. 1, and a ridged/grooved or prism surface (outer surface) 19 having a series of parallel grooves at 90 degrees. Incident radiation hitting the grooved surface may be refracted into the recapture element and then into the concentrator element 1.

Figure 3:
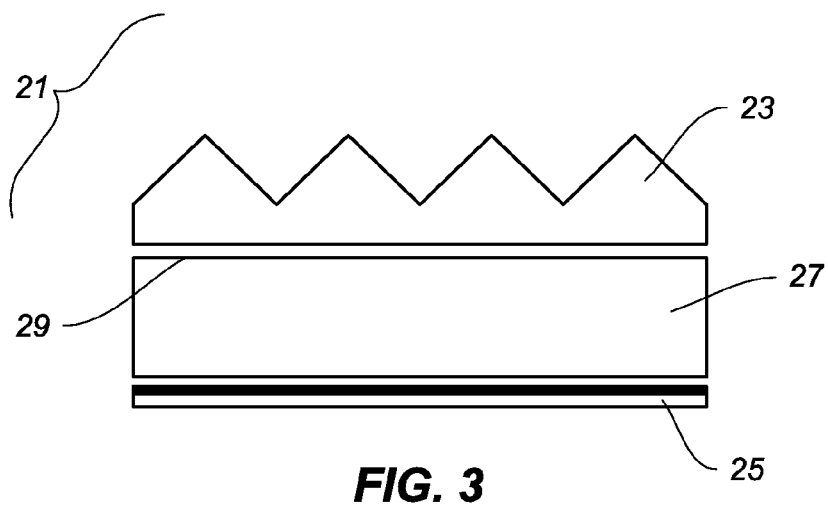
FIG. 3 is a diagram of a cross-section of a concentrator device of the present invention.

In FIG. 3, a radiation concentrator device 21 is shown in which the outer waveguide comprises a radiation recapture element 23 and a mirror 25 with the LPC element 27 sandwiched therebetween. The radiation recapture element 23, which is disposed in optical arrangement with the first incident light-receiving surface 29 of the concentrator element 27, is a microgrooved plastic sheet where the groove apex angle is 90 degrees (as shown in FIG. 2). In use, light enters the concentrator 21 via the grooved surface of the recapture element 23, is refracted at the grooved surface and passes therethrough. Provided it strikes the flat surface at the other side of the sheet with an angle of incidence less than the critical angle, it will be refracted out of the sheet and pass into the LPC element 27. For a grooved plastic sheet with a refractive index of 1.5, light will be refracted through the sheet at both surfaces provided it strikes the sheet within an acceptance cone of +/−40 degrees with respect to the normal to the plane of the sheet. Having passed through the grooved sheet the light impinges on the LPC element 27, where it will most likely be absorbed and re-emitted by radiation-absorptive material (e.g. a luminescent dye) within the LPC element 27. Light escaping from the LPC element will either strike the reflector surface of the outer guide (i.e. mirror 25) "below" the LPC or it will strike the flat surface of the microgrooved sheet "above" the LPC. In this case, the light will be refracted into the sheet recapture element 23 and will impinge on the grooved surface. The longitudinal grooves serve as 2 sides of a corner-cube retroreflector which has the property of sending light back parallel to the direction of incidence. Since one of the sides of the corner cube is effectively "missing", the grooves are able to reverse the direction of the incident light in two dimensions only, the third remaining unchanged. This total internal reflection effect is only possible over certain angles of incidence which ensure that the critical angle on the grooved face is exceeded. This is illustrated in FIG. 3 which shows a cross section through the device perpendicular to the plane of the grooves. This phenomenon has the effect of favouring light which has a component parallel to the groove direction (i.e. propagating towards the edge of the sheet in the groove direction). Overall, the acceptance region of the light may be increased by simply increasing the refractive index of the sheet. A proportion of the emitted light which is lost from the inner waveguide will also be lost from the outer waveguide but the significant fraction which is trapped greatly increases the efficiency of the dual waveguide structure compared with designs using a single LPC.

Once light is totally internally reflected by the microgrooved sheet, it will propagate in the outer waveguide structure until it emerges at the edge of the concentrator or is absorbed by the LPC. Light propagating in the outer waveguide actually passes through the LPC each time it traverses the guide and may therefore be reabsorbed by the LPC. There will therefore be some interchange between light propagating in the two guides. Since the absorption and emission process is not 100% efficient and since neither is the capture of light lost from the LPC by the outer guide, there will still be propagation losses which will limit the maximum size of the concentrator structure. Nevertheless, these losses are much smaller in the dual structure than in the single LPC structure.

Since the effect of the "reabsorption problem" is considerably reduced by the dual waveguide approach described in this invention, constraints on the selection of the best luminescers may be relaxed. In a single LPC, Stokes shift (the spectral shift between peak absorption and peak emission) must be maximised so that reabsorption will be minimised. This must be done without compromising light stability or quantum yield of luminescence. In the dual waveguide approach, now that large Stokes shift is no longer so important, there is more scope to choose luminescers with high quantum yield and excellent light stability.

Figure 5:
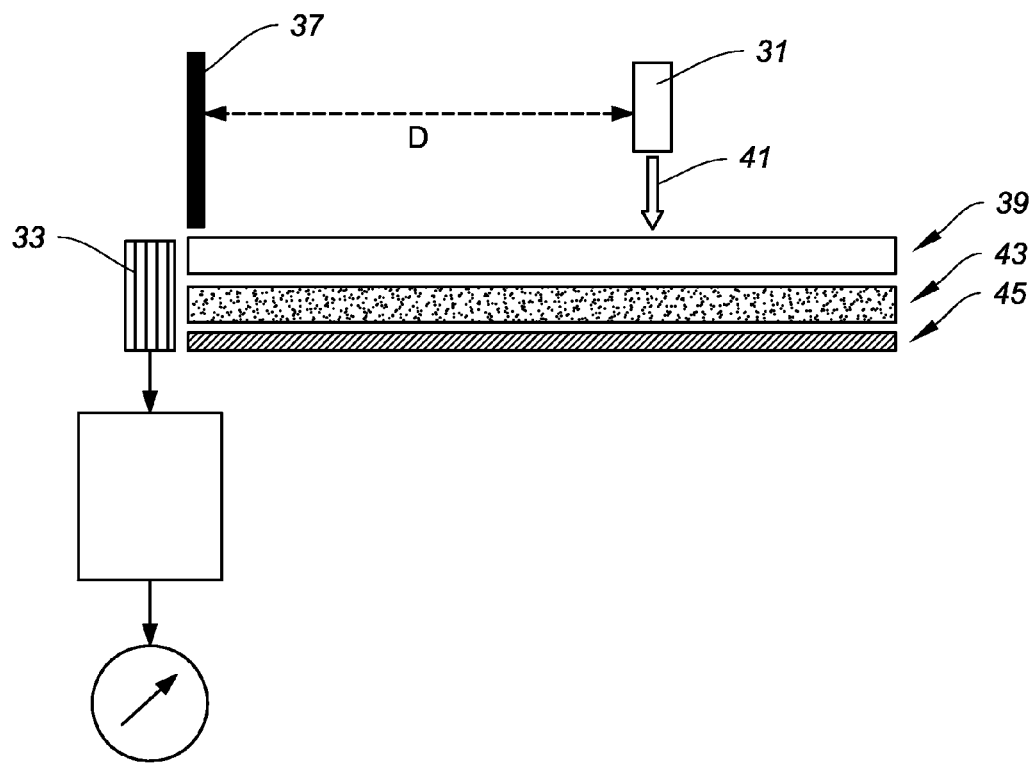
FIG. 5 is a diagram in cross-section of a device of FIG. 4.

Many other variants in the basic design shown in FIG. 5 are possible as is discussed in the text above (and the concepts described below may be considered in combination with the general disclosure above as particular embodiments):

1 The pair of pv cells aligned parallel to the groove direction may be replaced by mirrors or removed altogether
2 One of the pv cells perpendicular to the groove direction may be replaced by a mirror or may be removed altogether.
3 The mirror below the LPC forming one part of the outer guide may be a grooved sheet with the grooved surface as the outermost surface of the structure and with the groove direction aligned parallel to the grooves of the upper sheet.
4 Both or either of the upper and lower sheets forming the outer waveguide may be made of retroreflecting prismatic sheets. In this case, the function of the outer waveguide is to catch the light and redirect it back to the LPC so that it may be reabsorbed and continue propagating in the LPC.
5 The lower mirror forming part of the outer guide may be formed on the LPC.
6 The grooved sheet forming part of the outer guide may be in optical contact with the LPC.
7 The grooved sheet forming a part of the outer guide may be separate from the LPC but may be aligned with a small angle to the plane of the LPC
8 The refractive index of both the LPC and the grooved sheet may be adjusted to optimise the efficiency of the whole structure.
9 Several LPC's may be placed between the outer waveguide sheets. One reason for doing this is to cover a large spectral band. Each LPC might incorporate a single luminescer whose absorption spectrum might cover say 100 nm. Three LPCs with carefully chosen luminescers could therefore cover the visible spectrum from 400 nm to 700 nm. Another alternative to this approach is to use a single LPC sheet with three different luminescer species doped within.

Figure 6:
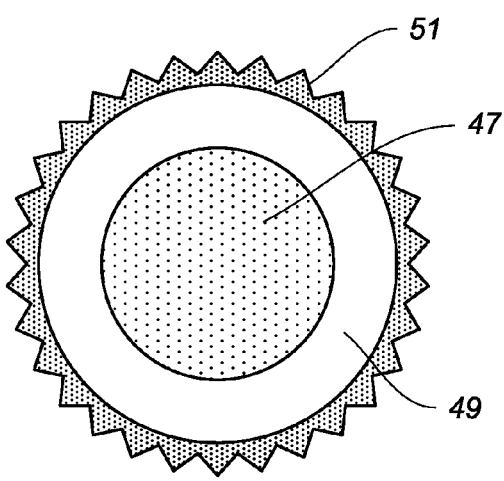
FIG. 6 is a cross-sectional diagram of a concentrator device according to an alternative embodiment of the present invention.

In FIG. 6, the concentrator element 47 is provided in an alternative form according to the present invention as a rod which is doped with a luminescent dye for absorbing and re-emitting capture solar radiation. The concentrator element 47 is provided with an intermediate element 49 in the form of concentric cylinder of radiation transmissive material doped or containing a dye substantially transparent to solar radiation but capable of absorbing emitted radiation from the luminescent dye of the concentrator element 47. The recapture element 51 is provided around the intermediate element 49 for the purpose of allowing transmission of incident light to the concentrator element and recapturing any escaped radiation. Alternatively, FIG. 6 may provide an embodiment of the invention whereby a solar concentrator element 49 is formed around an existing 'core' 47 having a reflective surface, which core may be a pillar or stanchion or other support structure. The recapture element 51 may then be formed directly adjacent the concentrator element 49 to recapture lost radiation. In both cases, the grooves of the recapture element will be aligned with the longitudinal axis of the cylindrical structure. In either situation, a PV cell may be provided at the ends of the cylinder to cover the ends of the concentrator element, optional intermediate element and recapture element.

Figure 7:
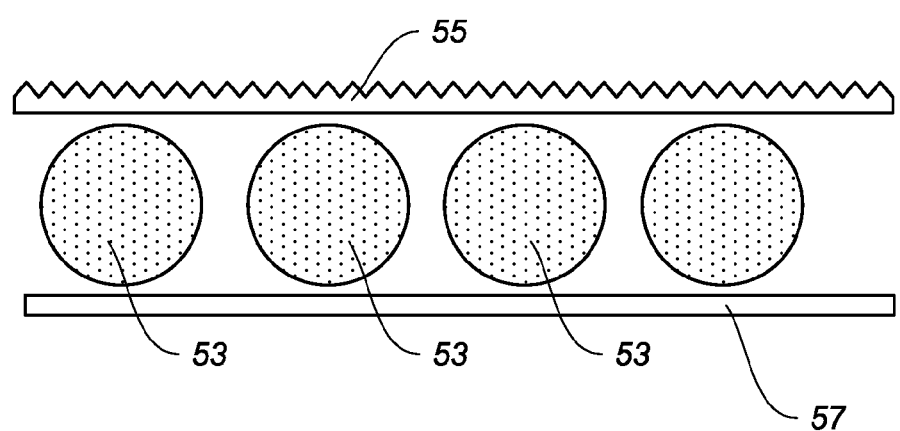
FIG. 7 is a cross-sectional diagram of a concentrator device according to a yet further embodiment of the present invention.

In FIG. 7, a layer of a plurality of concentrator elements 53 are provided on a mirror 57 and the plurality of concentrator elements 53 provided with a single recapture element 55, in which the grooves are aligned with the longitudinal axes of the parallel concentrator elements 53.

The options outlined here do not necessarily constitute the most efficient embodiment of the invention but they have considerable impact on manufacturing costs and on the physical properties of the structure and may therefore be preferable in some applications.

The invention will now be further described, without limitation as to the scope of the invention, according to the following examples.

EXAMPLES

Example 1

Figure 4:
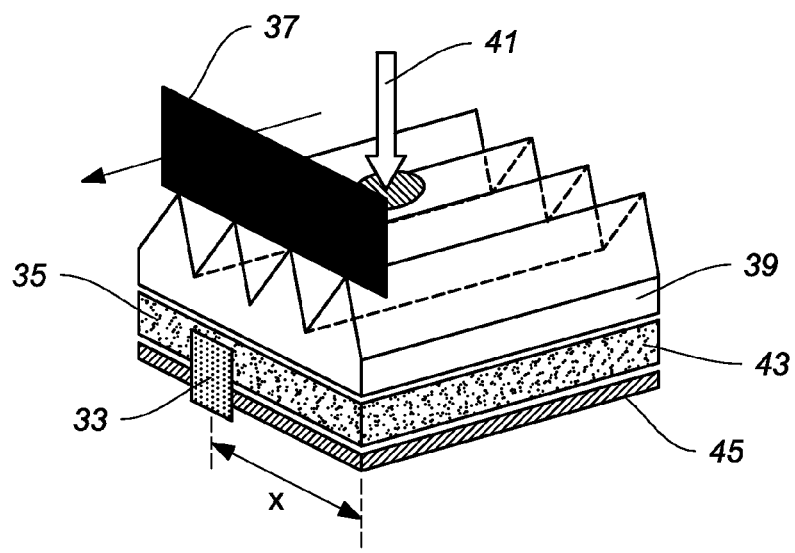
FIG. 4 is a perspective diagram of a concentrator device in accordance with the present invention used for testing.

A 0.27 mm thick sheet of a flexible plastic doped with a luminescent Rhodamine dye was used as the luminescent concentrator sheet element. The sheet was approximately 20 cm square. A green LED with 250 mCd output and λmax of 563 nm was coupled to a microscope with objective diameter 5.24 mm to provide a collimated incident beam. The peak wavelength of the LED corresponded very closely to the spectral absorption peak of the luminescent dye used. The dye density was such that about one third of the incident green light was transmitted in the sheet on a single pass. A large area photodiode was baffled with black card to provide a square aperture 33 with 5 mm side and was brought close to the edge of the luminescent sheet to detect luminescent emission from its edge face 35 as shown in FIG. 4. A black card sheet 37 was used as a baffle to prevent stray light from entering the detector directly from the LED 31. The photocurrent was amplified and measured. The LED light source was placed a few millimeters above a sheet of Scotch™ Optical Lighting Film (SOLF™) 39 obtained from 3M. SOLF™ has linear right angle prisms on one face as shown in FIG. 5. The sheet was positioned with the prisms facing the incident illumination 41. The distance D from the centre of the illuminated green light spot on the SOLF™ sheet was 8.6 cm. The luminescent sheet 43 was placed 2 mm below the lower face of the SOLF™ sheet. The gap was maintained by small spacers around the periphery of the sheet. A mirror 45 was placed just below the luminescent sheet. Neither the SOLF™ sheet nor the mirror, nor the detector was in optical contact with the luminescent sheet.

Figure 8:
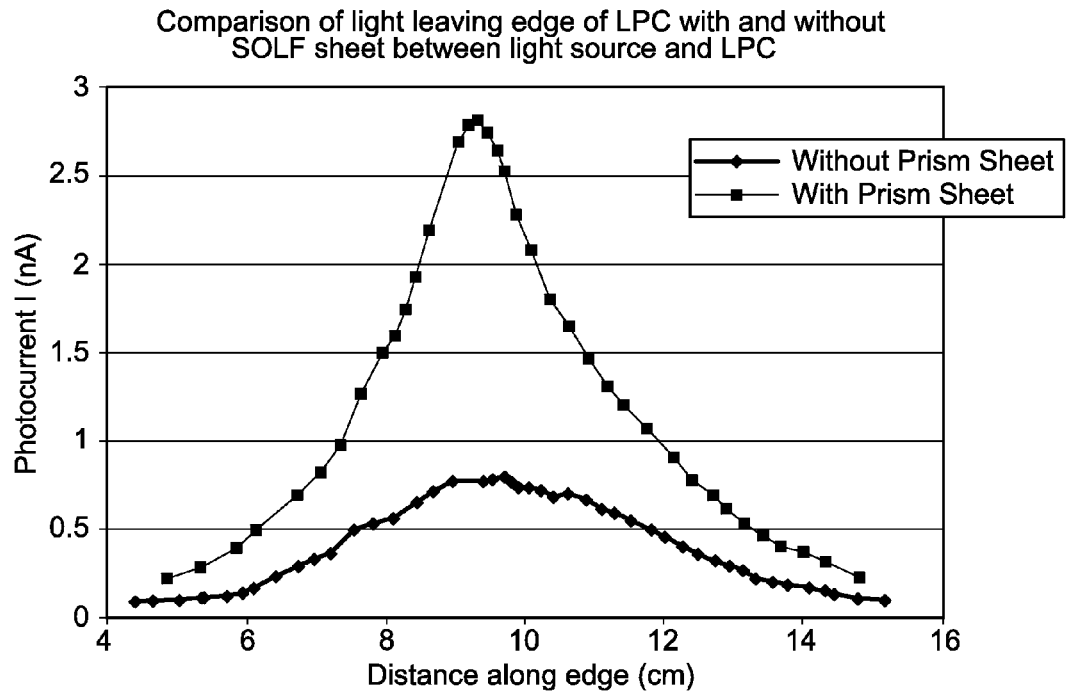
FIG. 8 is a graph of photocurrent against distance.

The detector 33 was moved along one of the edge faces of the luminescent sheet perpendicular to the SOLF™ groove direction as shown in FIG. 5. At each position, the distance, x, and the corresponding photocurrent were measured. This experiment was repeated with exactly the same experimental configuration except that the SOLF™ sheet was removed, leaving just the luminescent sheet and the mirror below. The comparative results are plotted in the graph in FIG. 8. Integrating under each curve from 5.33 to 14.33 cm, we find that the 267% more light reaches the edge of the concentrator when the SOLF™ is in place than without it.

Example 2

The thin plastic film doped with rhodamine dye was replaced by an A4 sized PMMA slab of thickness 3 mm doped with Lumogen™ F Red dye (BASF). Black adhesive tape was affixed to 3 side-faces of the sheet to stop edge reflections. It was noted that the use of the black tape reduced the signal at the maximum separation of LED and detector by about 10%. Again, as in Example 1, a mirror was placed below the luminescent sheet and a SOLF™ film was placed above. In this experiment, the green LED was moved and the detector held stationary to vary the distance D as shown in FIG. 5. A black baffle was placed between the LED and the detector to reduce stray light. The detector was a 100 mm² photodiode supplied by Melles Griot which was itself unbaffled to receive light from both the luminescent sheet and from the "outer waveguide" comprising the mirror and the SOLF™ sheet.

Figure 9:
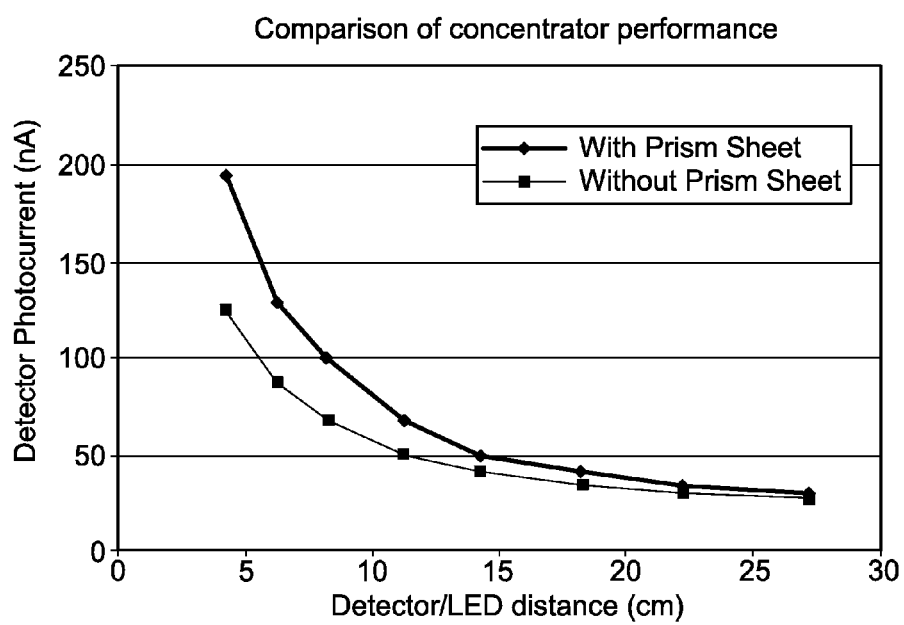
FIG. 9 is a graph of photocurrent against distance.

FIG. 9 shows the results of this experiment where there is a clear benefit of using the prism sheet. The differences between the greater benefit as seen in Example 1 versus Example 2 may be explained by the thinness of the doped plastic film and its much poorer optical quality. Both these effects reduce the effectiveness of the inner luminescent sheet as a waveguide and send more light into the outer waveguide. In Example 2, the optical quality of the luminescent sheet was better and the concentration of dye much less, due to greater thickness of the luminescent sheet, resulting in lower reabsorption losses, but consequently reduced concentration ratios.

The invention has been described in detail with particular reference to certain preferred embodiments thereof, but it will be understood that variations and modifications can be effected within the spirit and scope of the invention.

The invention claimed is:

1. A radiation concentrator device for concentrating incident radiation comprising at least one concentrator element and at least one recapture element, wherein the at least one concentrator element comprises at least one transmissive surface for receiving radiation into the element and at least one concentration point for positioning a radiation receiving device to which point radiation may be directed by multiple reflections; and wherein the at least one recapture element, which is disposed in optical arrangement with the at least one transmissive surface of the concentrator element, comprises at least one concentration point for receiving recaptured radiation and is configured to
   a. transmit incident radiation to the concentrating element,
   b. re-capture by optical means escaped radiation from the concentrator element; and
   c. redirect at least a portion of the escaped radiation to the at least one concentration point.

2. A radiation concentrator device as claimed in claim 1, wherein the concentrator element comprises a radiation-absorptive material capable of absorbing incident radiation and re-emitting radiation.

3. A radiation concentrator device as claimed in claim 1, wherein the concentrator element is a luminescent concentrator element having a first transmissive surface for receiving incident radiation into the element and at least one surface for a radiation receiving device and which luminescent concentrator element has disposed thereon and/or therein one or more luminescent material capable of absorbing radiation and re-emitting radiation.

4. A radiation concentrator device as claimed in claim 1, wherein the recapture element comprises an inner surface disposed adjacent to and in optical arrangement with the transmissive surface of the concentrating element and an outer surface for receiving incident radiation into the radiation concentrator device and by which escaped radiation from the concentrator element may be retained within the radiation concentrator device by reflection from said outer surface.

5. A radiation concentrator device as claimed in claim 4, wherein the outer surface of the recapture element comprises a plurality of ridges and grooves.

6. A radiation concentrator device as claimed in claim 5, wherein the plurality of ridges and grooves are substantially parallel.

7. A radiation concentrator device as claimed in claim 5, wherein the plurality of ridges and grooves form a corrugated surface of suitably aligned planar surfaces.

8. A radiation concentrator device as claimed in claim 7, wherein the corrugated planar surfaces are arranged relative to one another at ridge and groove angles of from 75° to 105°.

9. A radiation concentrator device as claimed in claim 8, wherein the ridge and groove angles are substantially right angles.

10. A radiation concentrator device as claimed in claim 1, wherein the transmissive surface of the concentrator element is a planar surface.

11. A radiation concentrator device as claimed in claim 1, which comprises:
   a luminescent concentrator element in sheet form having a first planar transmissive surface for receiving radiation and a second planar surface substantially co-planar with said first planar transmissive surface, at least one edge to which radiation may be directed by internal reflection for receipt by a radiation receiving device, and disposed thereon and/or therein one or more luminescent material capable of absorbing radiation and re-emitting radiation; and
   a recapture element comprising a planar inner surface disposed in co-planar optical arrangement with the planar surface of the concentrator element and an outer surface for receiving incident radiation into the concentrator, which outer surface comprises a plurality of ridges and grooves by which escaped radiation from the concentrating element may be retained within the concentrator by means of reflection against the outer surface.

12. A radiation concentrator device as claimed in claim 11, wherein the plurality of ridges and grooves are substantially parallel and formed by a series of aligned corrugated planar surfaces.

13. A radiation concentrator device as claimed in claim 11, wherein the concentrator element is a quadrangular sheet having four edges at least one of which is configured for optical arrangement with a radiation receiving device.

14. A radiation concentrator device as claimed in claim 11, wherein the second planar surface of the concentrator element is provided with a reflecting means for reflecting incident and re-emitted radiation striking the second planar surface from within the concentrator element back into the concentrator element.

15. A photovoltaic device comprising a radiation concentrator device as defined in claim 1 and one or more photovoltaic cells or array of photovoltaic cells.

* * * * *